United States Patent
Holm et al.

(10) Patent No.: US 9,841,469 B2
(45) Date of Patent: Dec. 12, 2017

(54) MAGNETIC FIELD SENSOR WITH MULTIPLE SENSE LAYER MAGNETIZATION ORIENTATIONS

(71) Applicant: FREESCALE SEMICONDUCTOR, INC., Austin, TX (US)

(72) Inventors: Paige M. Holm, Phoenix, AZ (US); Lianjun Liu, Chandler, AZ (US)

(73) Assignee: NXP USA, Inc., Austin, TX (US)

(*) Notice: Subject to any disclaimer, the term of this patent is extended or adjusted under 35 U.S.C. 154(b) by 182 days.

(21) Appl. No.: 15/006,911

(22) Filed: Jan. 26, 2016

(65) Prior Publication Data
US 2017/0212175 A1 Jul. 27, 2017

(51) Int. Cl.
*G01R 33/00* (2006.01)
*G01R 33/09* (2006.01)
*G01R 17/10* (2006.01)

(52) U.S. Cl.
CPC ......... *G01R 33/0005* (2013.01); *G01R 17/10* (2013.01); *G01R 33/0011* (2013.01); *G01R 33/093* (2013.01); *G01R 33/098* (2013.01)

(58) Field of Classification Search
CPC .. G01R 33/0005; G01R 17/10; G01R 33/098; G01R 33/093; G01R 33/0011
USPC ........ 324/219–252, 200, 207.2–207.24, 500, 324/529–530, 750.12, 750.21, 754.17, 324/754.29; 338/32 R, 32 H; 365/157–158, 170–173, 225.5;
(Continued)

(56) References Cited

U.S. PATENT DOCUMENTS

| 5,592,082 A | 1/1997 | Kuriyama |
| 5,737,155 A | 4/1998 | George et al. |

(Continued)

FOREIGN PATENT DOCUMENTS

| EP | 2 860 542 A1 | 4/2015 |
| EP | 2 860 543 A1 | 4/2015 |

(Continued)

OTHER PUBLICATIONS

Non Final Office Action; U.S. Appl. No. 15/079,764; 38 pages (Oct. 11, 2017).

(Continued)

*Primary Examiner* — Melissa Koval
*Assistant Examiner* — Trung Nguyen
(74) *Attorney, Agent, or Firm* — Charlene R. Jacobsen

(57) ABSTRACT

A magnetic field sensor comprises a sensor bridge having multiple sensor legs. Each sensor leg includes magnetoresistive sense elements, each comprising a pinned layer having a reference magnetization parallel to a plane of the sensor and a sense layer having a sense magnetization. A permanent magnet layer spaced apart from the sense elements magnetically biases the sense magnetization into an out-of-plane direction that is non-perpendicular to the plane of the sensor. The sense magnetization of a portion of the sense elements is oriented in a first direction and the sense magnetization of a different portion of the sense elements is oriented in a second direction differing from the first direction to generate two unique bias field vectors of the sense layers which enables detection of the external magnetic field in a sensing direction that is perpendicular to the plane of the magnetic field sensor without inter-axis coupling of sensor response.

20 Claims, 6 Drawing Sheets

(58) Field of Classification Search
USPC .... 73/514.31, 514.39, 520.01, 779, 862.193, 73/862.333
See application file for complete search history.

(56) References Cited

U.S. PATENT DOCUMENTS

| | | | |
|---|---|---|---|
| 6,501,678 B1 | 12/2002 | Lenssen et al. | |
| 7,589,528 B2 | 9/2009 | Sato et al. | |
| 7,965,077 B2 | 6/2011 | Engel et al. | |
| 8,816,683 B2 * | 8/2014 | Wang | G01R 33/098 324/207.21 |
| 2004/0023064 A1 | 2/2004 | Ehresmann et al. | |
| 2004/0137275 A1 | 7/2004 | Jander et al. | |
| 2009/0027048 A1 | 1/2009 | Sato et al. | |
| 2009/0237074 A1 | 9/2009 | Kou et al. | |
| 2010/0118447 A1 | 5/2010 | Hammerschmidt et al. | |
| 2010/0231214 A1 | 9/2010 | Zhou | |
| 2010/0276389 A1 | 11/2010 | Mather et al. | |
| 2011/0074406 A1 | 3/2011 | Mather et al. | |
| 2011/0134572 A1 | 6/2011 | Qiu et al. | |
| 2011/0244599 A1 | 10/2011 | Whig et al. | |
| 2012/0212217 A1 * | 8/2012 | Engel | G01R 33/098 324/252 |
| 2012/0281319 A1 | 11/2012 | Singleton et al. | |
| 2012/0300402 A1 | 11/2012 | Vos | |
| 2013/0277781 A1 | 10/2013 | Deak et al. | |
| 2013/0300402 A1 | 11/2013 | Liu et al. | |
| 2013/0328556 A1 | 12/2013 | Granig et al. | |
| 2014/0021571 A1 | 1/2014 | Lei et al. | |
| 2014/0035570 A1 | 2/2014 | Jin et al. | |
| 2014/0035573 A1 | 2/2014 | Deak et al. | |
| 2014/0225605 A1 | 8/2014 | Lei et al. | |
| 2014/0247042 A1 | 9/2014 | Lei et al. | |
| 2014/0292318 A1 | 10/2014 | Wang et al. | |
| 2014/0327437 A1 | 11/2014 | Han et al. | |
| 2015/0091560 A1 | 4/2015 | Deak et al. | |
| 2015/0125966 A1 | 5/2015 | Liu et al. | |
| 2015/0137292 A1 | 5/2015 | Amiri et al. | |
| 2015/0145504 A1 | 5/2015 | Bai et al. | |
| 2015/0191560 A1 | 7/2015 | Andrews et al. | |
| 2015/0309125 A1 | 10/2015 | Huang et al. | |
| 2015/0346290 A1 | 12/2015 | Holm et al. | |
| 2015/0364677 A1 | 12/2015 | Deak et al. | |
| 2016/0056371 A1 | 2/2016 | Lei et al. | |
| 2017/0123016 A1 | 5/2017 | Deak | |
| 2017/0212176 A1 | 7/2017 | Holm et al. | |
| 2017/0212189 A1 | 7/2017 | Holm et al. | |
| 2017/0276738 A1 | 9/2017 | Holm et al. | |

FOREIGN PATENT DOCUMENTS

| | | |
|---|---|---|
| EP | 3 229 035 A1 | 10/2017 |
| WO | 2008/020817 A1 | 2/2008 |
| WO | 2015/158243 A1 | 10/2015 |

OTHER PUBLICATIONS

Notice of Allowance; U.S. Appl. No. 15/134,573; 21 pages (Oct. 16, 2017).
Notice of Allowance; U.S. Appl. No. 15/134,573 (Aug. 1, 2017).
U.S. Appl. No. 15/134,573, not yet published; (Apr. 21, 2016).
Notice of Allowance; U.S. Appl. No. 15/006,952; May 10, 2017.
Notice of Allowance; U.S. Appl. No. 15/006,746;12 pages (Oct. 6, 2017).
Non Final Office Action; U.S. Appl. No. 15/006,746; 25 pages (Apr. 4, 2017).
Restriction/Election; U.S. Appl. No. 15/079,764; 8 pages (Aug. 04, 2017).
U.S. Appl. No. 15/093,224; Not Yet Published; Filed Apr. 7, 2016.
Non Final Office Action; U.S. Appl. No. 15/079,764 (Oct. 11, 2017).

* cited by examiner

PRIOR ART

MAGNETIC FIELD SENSOR WITH MULTIPLE SENSE LAYER MAGNETIZATION ORIENTATIONS

TECHNICAL FIELD OF THE INVENTION

The present invention relates generally to magnetoelectronic devices. More specifically, the present invention relates to a magnetic field sensor with multiple axis sensing and permanent magnet biasing.

BACKGROUND OF THE INVENTION

Magnetic field sensors, also known as magnetometers, are widely used in a number of applications including in, for example, compass, security, and military applications, geophysics and space research, biomagnetism and medical applications, and non-destructive testing. Magnetic field sensors are typically based on semiconductor materials (e.g., Hall sensors, magnetoresistors, and so forth) and ferromagnetic materials (e.g., ferromagnetic magnetoresistors and flux guides). Other magnetic field sensors utilize optical, resonant, and superconducting properties.

In many Earth's field magnetic sensing applications, especially those involving compassing or orientation, it is extremely desirable to have three-axis sensing capability. In order to achieve low cost of such sensors, it is also desirable that the solution be a single chip or even fully integrable onto the accompanying application specific integrated circuit (ASIC) die. In handheld and miniaturized applications it is also critical to minimize power consumption in order to extend battery life.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail a magnetic field sensor capable of sensing magnetic fields along one or more mutually exclusive sense axes, typically referred to as the X-axis, Y-axis, and Z-axis. More particularly, sensor bridge designs of magnetoresistive sense elements are implemented for each sense axis. The sensor bridges incorporate multiple orientations of reference magnetization of the pinned layer, along with out-of-plane biasing of the sense layer for each of the magnetoresistive sense elements. Additionally, one sensor bridge design is utilized for sensing an external magnetic field that is perpendicular to the plane of the magnetic field sensor package and includes at least one permanent magnetic layer with a single magnetization direction to enable sensing of the out-of-plane external magnetic field without the use of flux concentrators. More particularly, the at least one permanent magnet layer is strategically patterned (shape and position) to generate two unique, out-of-plane external bias field vectors of the sense layer to allow a single sensor bridge to respond to the out-of-plane external magnetic field without inter-axis coupling of sensor response. The various inventive concepts and principles embodied herein enable an ultra low power, multiple sense axis magnetic field sensor without detrimental perming effects for improved sensitivity, reliability, and cost savings.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like may be used herein solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
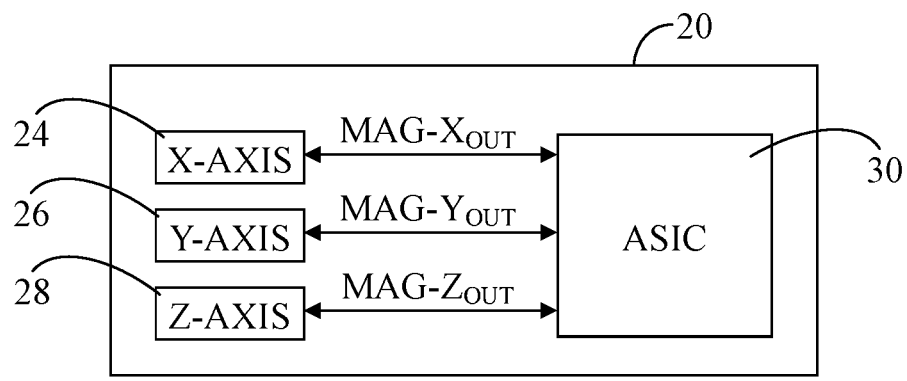
FIG. 1 shows a simplified block diagram of a magnetic field sensor package.

Referring to FIG. 1, FIG. 1 shows a simplified block diagram of a magnetic field sensor package 20. Magnetic field sensor package 20 may be implemented in any device or system in which magnetic field sensing is required, for example, in compass, security, and military applications, in geophysics and space research applications, in biomagnetism and medical applications, and/or in non-destructive testing. In this example, sensor package 20 may be adapted to sense a magnetic field along three axes. Hence, sensor package 20 includes an X-axis magnetic field sensor 24, a Y-axis magnetic field sensor 26, and a Z-axis magnetic field sensor 28. Magnetic field sensors 24, 26, 28 may be coupled to, or otherwise in communication with, an application specific integrated circuit (ASIC) 30 to form sensor package 20. ASIC 30 performs some or all functions including, but not limited to, signal conditioning and data management, reset and stabilization control, bridge/output multiplexing, self-test, electrostatic discharge (ESD) protection, and so forth.

In an exemplary configuration, magnetic field sensors 24, 26, 28 may be magnetic tunnel junction (MTJ) sensors. An MTJ structure includes a metal-insulator-metal layer sandwich in which the metal layers are ferromagnetic and the insulator layer is very thin. Electrically, this forms a tunnel diode in which electrons can tunnel from one ferromagnet into the other. Such a tunnel diode exhibits transport characteristics that depend, not only on the voltage bias, but also on the magnetic states of the top and bottom electrodes.

Figure 2:
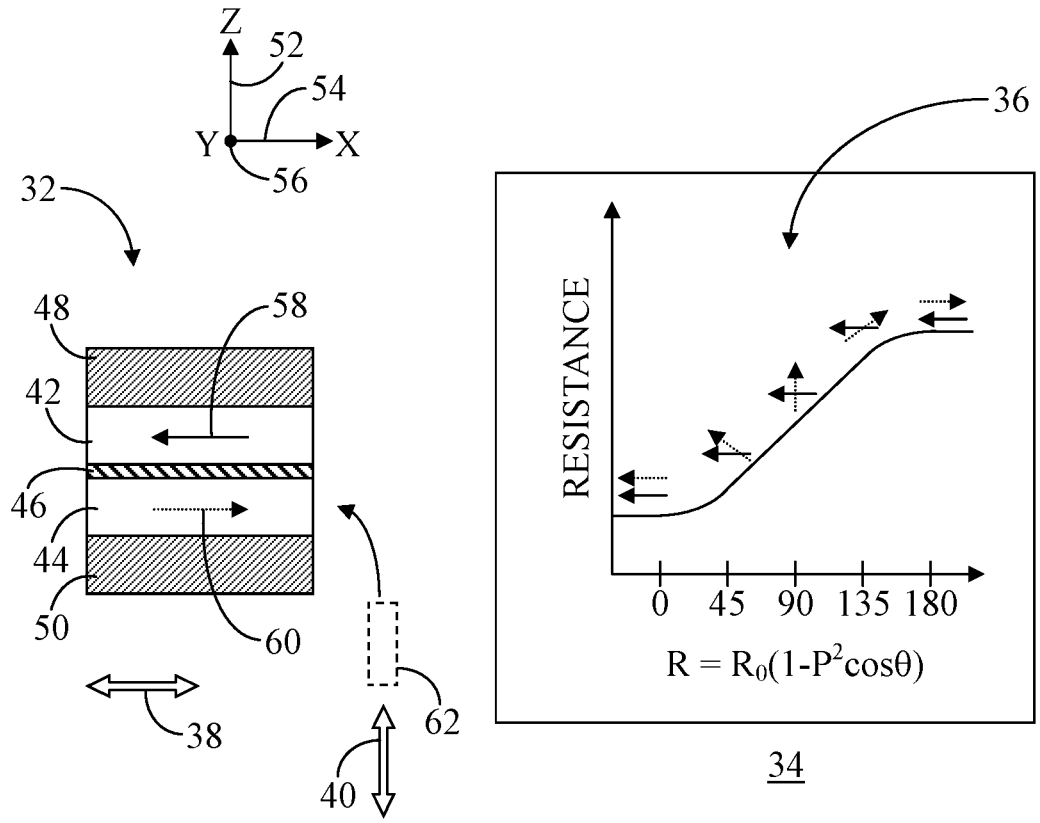
FIG. 2 shows a simplified side view of an exemplary magnetoresistive sense element with an accompanying plot of resistances that may occur in the presence of an external magnetic field.

FIG. 2 shows a simplified side view of an exemplary magnetoresistive sense element 32 with an accompanying plot 34 of a variable resistance 36 in the presence of an external magnetic field, represented by arrows 38, 40. More particularly, exemplary magnetoresistive sense element 32 is an exemplary MTJ structure that includes ferromagnetic layers 42, 44 separated by an insulator layer 46. An electrode 48 may be in electrical communication with ferromagnetic layer 42 and another electrode 50 may be in electrical communication with ferromagnetic layer 44. This structure may be formed within a dielectric material, not shown herein for simplicity.

In the side view illustration of FIG. 2, a Z-axis 52 is oriented up-and-down on the page, an X-axis 54 is oriented right-and-left on the page, and a Y-axis 56 is represented as a dot that depicts an axis going either into or out of the page on which FIG. 2 is situated. Thus, the X-Y plane in this side view illustration is oriented right-and-left and into or out of the page. Accordingly, external magnetic field 38 represents a magnetic field that is parallel to the X-Y plane of magnetoresistive sense element 32. More particularly, external magnetic field 38 is generally parallel to X-axis 54. Conversely, external magnetic field 40 represents a magnetic field that is perpendicular to the X-Y plane of magnetoresistive sense element 32. That is, external magnetic field is generally parallel to Z-axis 52.

Ferromagnetic layer 42 may be fixed, or "pinned," to have a reference magnetization, as represented by a solid arrow 58. Therefore, ferromagnetic layer 42 is referred to hereinafter as pinned layer 42. Ferromagnetic layer 44 is "free" to respond to, i.e., sense, the applied magnetic field (e.g., external magnetic field 38, 40) to provide a sense magnetization, represented by a dotted arrow 60. Sense magnetization 60 modulates the measured resistance 36. Accordingly, ferromagnetic layer 44 is referred to hereinafter as sense layer 44.

At a fixed voltage bias, resistance 36 depends upon the states of electrodes 48, 50. Since electrodes 48, 50 are electrically coupled with pinned and sense layers 42, 44, respectively, the states of electrodes 48, 50 depend upon the alignment of the magnetic moments of the pinned and sense layers 42, 44. By way of example and referring to plot 34, in the presence of X-axis external magnetic field 38, when the magnetic moments of pinned and sense layers 42, 44 are parallel (i.e., the vectors lie along parallel lines and point in the same direction) resistance 36 of the junction is lowest. However, resistance 36 of the junction is highest when the magnetic moments are anti-parallel (i.e., the vectors lie along parallel lines but point in the opposite direction). And in between, resistance 36 of the junction varies as the cosine of the angle between magnetic moments. One or more MTJ resistors, such as magnetoresistive sense element 32, may be utilized to form either of X-axis or Y-axis magnetic field sensors 24, 26 (FIG. 1) for sensing an external magnetic field that is parallel to the X-Y plane of magnetoresistive sense element 32.

In order to sense Z-axis magnetic field 40 in a direction perpendicular to the X-Y plane of magnetoresistive sense element 32, one or more flux guides 62 (one shown in dashed line form) are also formed within the dielectric material (not shown) in which magnetoresistive sense element 32 is formed. Per convention, flux guides 62 can be used to guide Z-axis magnetic field 40 into the X-Y plane. Flux guides 62 are generally thin, narrow sheets of magnetic material typically used to guide flux, i.e., Z-axis magnetic field 40, to a preferred location. With the use of flux guides 62 incorporated into, for example, Z-axis magnetic field sensor 28 (FIG. 1), Z-axis magnetic field 40 is suitably guided so that it can be sensed using one or more in-plane magnetoresistive sense elements 32.

For optimal Z axis response, flux guides 62 have a preferred magnetization orientation. That is, the magnetic polarization for each of flux guides 62 will be directed in a uniform, i.e., generally single, direction. Unfortunately, flux guides 62 are susceptible to corruption by exposure to externally applied magnetic fields (e.g., disturbing fields of approximately one hundred Gauss or more). This corruption, typically referred to as perming, can alter the magnetic state of flux guides 62 leading to unstable device characteristics including offset, axis alignment, and noise. Large offset shifts, axis rotations, and excess noise can be very difficult or even impossible to compensate/calibrate out of the sensor response and can render Z-axis magnetic field sensor 28 unusable.

Embodiments discussed herein employ a triad of sensor bridge designs for X-axis 54, Y-axis 56, and Z-axis 52 magnetic field sensing. The sensor bridge designs include multiple orientations of reference magnetization of the pinned layer and out-of-plane orientations of sense magnetization of the sense layer of a plurality of in-plane magnetoresistive sense elements. Additionally, external biasing of the sense layer of the in-plane magnetoresistive sense elements of the Z-axis sensor bridge utilizes one or more permanent magnet layers with a single magnetization direction to enable Z-axis sensing without using flux guides. Moreover, one or more permanent magnet layers are strategically patterned (shape and position) to generate two unique, out-of-plane external bias field vectors of the sense layer of the in-plane magnetoresistive sense elements of the Z-axis sensor bridge to allow a single sensor bridge to respond to the out-of-plane external magnetic field without inter-axis coupling of sensor response.

Figure 3:
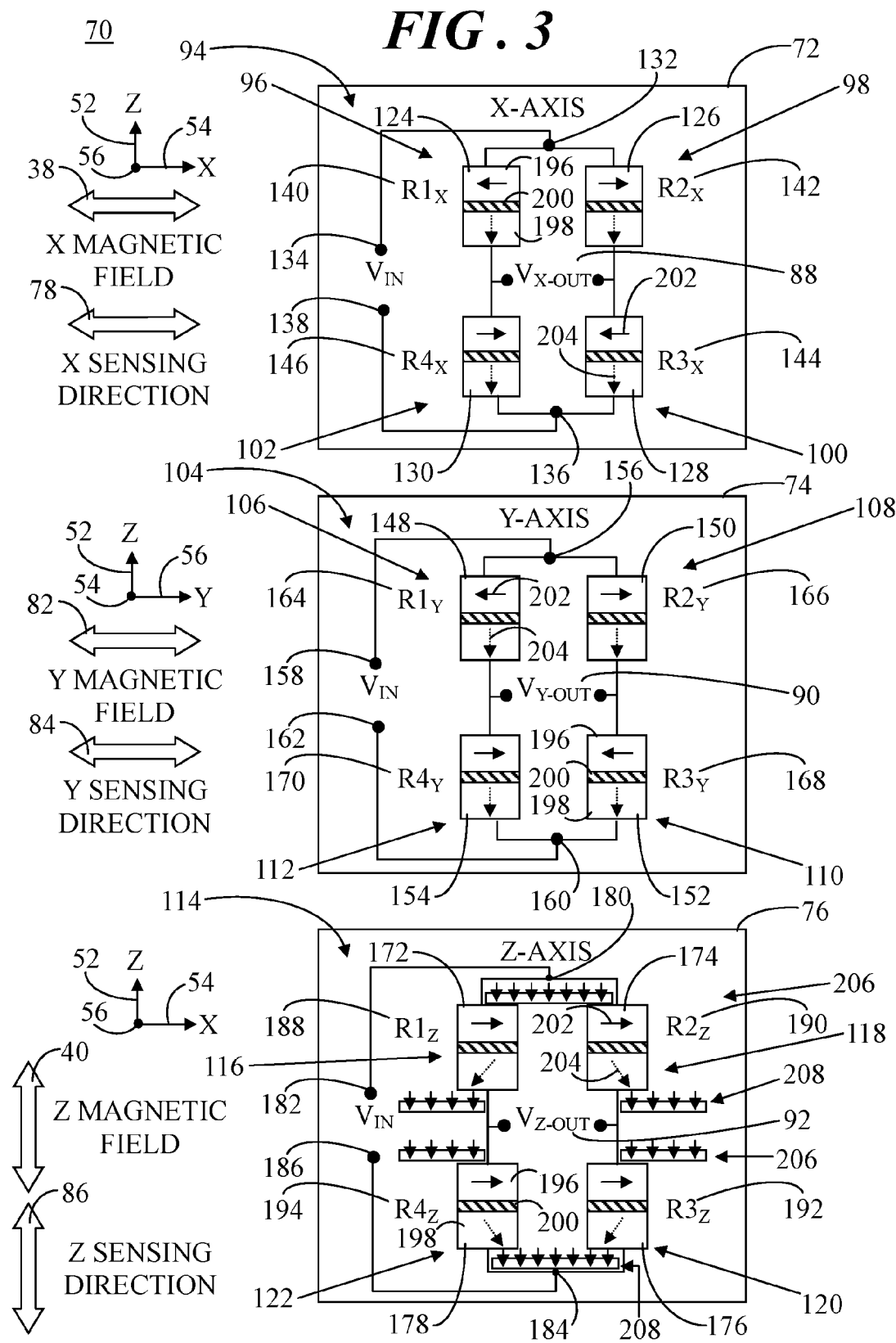
FIG. 3 shows a schematic view of a magnetic field sensor having multiple sense axes.

FIG. 3 shows a schematic view of a magnetic field sensor package 70 having multiple sense axes in accordance with an embodiment. More particularly, magnetic field sensor package 70 includes an X-axis magnetic field sensor 72, a Y-axis magnetic field sensor 74, and a Z-axis magnetic field sensor 76 each of which is capable of sensing an external magnetic field along mutually exclusive sense axes. Accordingly, X-axis magnetic field sensor 72 is sensitive to X-axis external magnetic field 38 in a sensing direction (referred to herein as X sensing direction 78) parallel to X-axis 54 and therefore parallel to an X-Y plane 80 (see FIG. 4) of magnetic field sensor package 70. Y-axis magnetic field sensor 74 is sensitive to a Y-axis external magnetic field 82 in a sensing direction (referred to herein as a Y sensing direction 84) parallel to Y-axis 56 and therefore also parallel to X-Y plane 80 (FIG. 4) of magnetic field sensor package 70. Conversely, Z-axis magnetic field sensor 76 is sensitive to Z-axis external magnetic field 40 in a sensing direction (referred to herein as a Z sensing direction 86) parallel to Z-axis 52 and therefore perpendicular to X-Y plane 80.

X-axis magnetic field sensor 72 produces an output signal 88, labeled $V_{X-OUT}$, indicative of the magnitude of X-axis external magnetic field 38. Y-axis magnetic field sensor 74 produces an output signal 90, labeled $V_{Y\text{-}OUT}$, indicative of the magnitude of Y-axis external magnetic field 82. And, Z-axis magnetic field sensor 76 produces an output signal 92, labeled $V_{Z\text{-}OUT}$, indicative of the magnitude of Z-axis external magnetic field 40.

Each of magnetic field sensors 72, 74, 76 includes a sensor bridge, and more particularly a Wheatstone bridge configuration. Thus, X-axis magnetic field sensor 72 is configured as an X-axis Wheatstone bridge 94 that includes first, second, third, and fourth sensor legs 96, 98, 100, 102, respectively. Likewise, Y-axis magnetic field sensor 74 is configured as a Y-axis Wheatstone bridge 104 that includes first, second, third, and fourth sensor legs 106, 108, 110, 112, respectively. And, Z-axis magnetic field sensor 76 is configured as a Z-axis Wheatstone bridge 114 that includes first, second, third, and fourth sensor legs 116, 118, 120, 122, respectively.

Referring particularly to X-axis Wheatstone bridge 94 of X-axis magnetic field sensor 72, first sensor leg 96 includes one or more first magnetoresistive sense elements 124, second sensor leg 98 includes one or more second magnetoresistive sense elements 126, third sensor leg 100 includes one or more third magnetoresistive sense elements 128, and fourth sensor leg 102 includes one or more fourth magnetoresistive sense elements 130. Only one each of magnetoresistive sense elements 124, 126, 128, 130 is shown for simplicity of illustration. Those skilled in the art will readily recognize that X-axis magnetic field sensor 72 can include any number of magnetoresistive sense elements 124, 126, 128, 128.

First and fourth magnetoresistive sense elements 124, 130 are coupled in series to form a first half of X-axis Wheatstone bridge 94 and second and third magnetoresistive sense elements 126, 128 are coupled in series to form a second half of X-axis Wheatstone bridge 94. Thus, the first half of X-axis Wheatstone bridge 94 is coupled in parallel with the second half of X-axis Wheatstone bridge 94 such that a junction 132 of first and second magnetoresistive sense elements 124, 126 forms a first input terminal 134 and a junction 136 of third and fourth magnetoresistive sense elements 128, 130 forms a second input terminal 138.

For illustrative purposes, resistances are provided in association with magnetoresistive sense elements 124, 126, 128, 130. In this example, a resistance 140, $R1_X$, represents the signal output of first magnetoresistive sense element 124. A resistance 142, $R2_X$, represents the signal output of second magnetoresistive sense element 126. A resistance 144, $R3_X$, represents the signal output of third magnetoresistive sense element 128. And, a resistance 146, $R4_X$, represents the signal output of fourth magnetoresistive sense element 130.

Referring now to Y-axis Wheatstone bridge 104 of Y-axis magnetic field sensor 74, first sensor leg 106 includes one or more first magnetoresistive sense elements 148, second sensor leg 108 includes one or more second magnetoresistive sense elements 150, third sensor leg 110 includes one or more third magnetoresistive sense elements 152, and fourth sensor leg 112 includes one or more fourth magnetoresistive sense elements 154. First and fourth magnetoresistive sense elements 148, 154 are coupled in series to form a first half of Y-axis Wheatstone bridge 104 and second and third magnetoresistive sense elements 150, 152 are coupled in series to form a second half of Y-axis Wheatstone bridge 104. Thus, the first half of Y-axis Wheatstone bridge 104 is coupled in parallel with the second half of Y-axis Wheatstone bridge 104 such that a junction 156 of first and second magnetoresistive sense elements 148, 150 forms a first input terminal 158 and a junction 160 of third and fourth magnetoresistive sense elements 152, 154 forms a second input terminal 162.

Resistances are provided in association with magnetoresistive sense elements 148, 150, 152, 154. In this example, a resistance 164, $R1_Y$, represents the signal output of first magnetoresistive sense element 148. A resistance 166, $R2_Y$, represents the signal output of second magnetoresistive sense element 150. A resistance 168, $R3_Y$, represents the signal output of third magnetoresistive sense element 152. And, a resistance 170, $R4_Y$, represents the signal output of fourth magnetoresistive sense element 154.

Referring now to Z-axis Wheatstone bridge 114 of Z-axis magnetic field sensor 76, first sensor leg 116 includes one or more first magnetoresistive sense elements 172, second sensor leg 118 includes one or more second magnetoresistive sense elements 174, third sensor leg 120 includes one or more third magnetoresistive sense elements 176, and fourth sensor leg 122 includes one or more fourth magnetoresistive sense elements 178. First and fourth magnetoresistive sense elements 172, 178 are coupled in series to form a first half of Z-axis Wheatstone bridge 114 and second and third magnetoresistive sense elements 174, 176 are coupled in series to form a second half of Z-axis Wheatstone bridge 114. Thus, the first half of Z-axis Wheatstone bridge 114 is coupled in parallel with the second half of Z-axis Wheatstone bridge 114 such that a junction 180 of first and second magnetoresistive sense elements 172, 174 forms a first input terminal 182 and a junction 184 of third and fourth magnetoresistive sense elements 176, 178 forms a second input terminal 186.

Resistances are provided in association with magnetoresistive sense elements 172, 174, 176, 178. In this example, a resistance 188, $R1_Z$, represents the signal output of first magnetoresistive sense element 172. A resistance 190, $R2_Z$, represents the signal output of second magnetoresistive sense element 174. A resistance 192, $R3_Z$, represents the signal output of third magnetoresistive sense element 176. And, a resistance 194, $R4_Z$, represents the signal output of fourth magnetoresistive sense element 178.

Each of magnetoresistive sense elements 124, 126, 130, 132, 148, 150, 152, 154, 172, 174, 176, 178 is a magnetic tunnel junction (MTJ) sense element. Thus, each of sense elements 124, 126, 130, 132, 148, 150, 152, 154, 172, 174, 176, 178 includes a ferromagnetic pinned layer 196 and a ferromagnetic sense layer 198 separated by an insulator layer 200. As discussed above, electrodes may be in electrical communication with each of pinned and sense layers 196, 198 and the structure may be formed within a dielectric material. The electrodes and dielectric material are not shown herein for simplicity.

Figure 4:
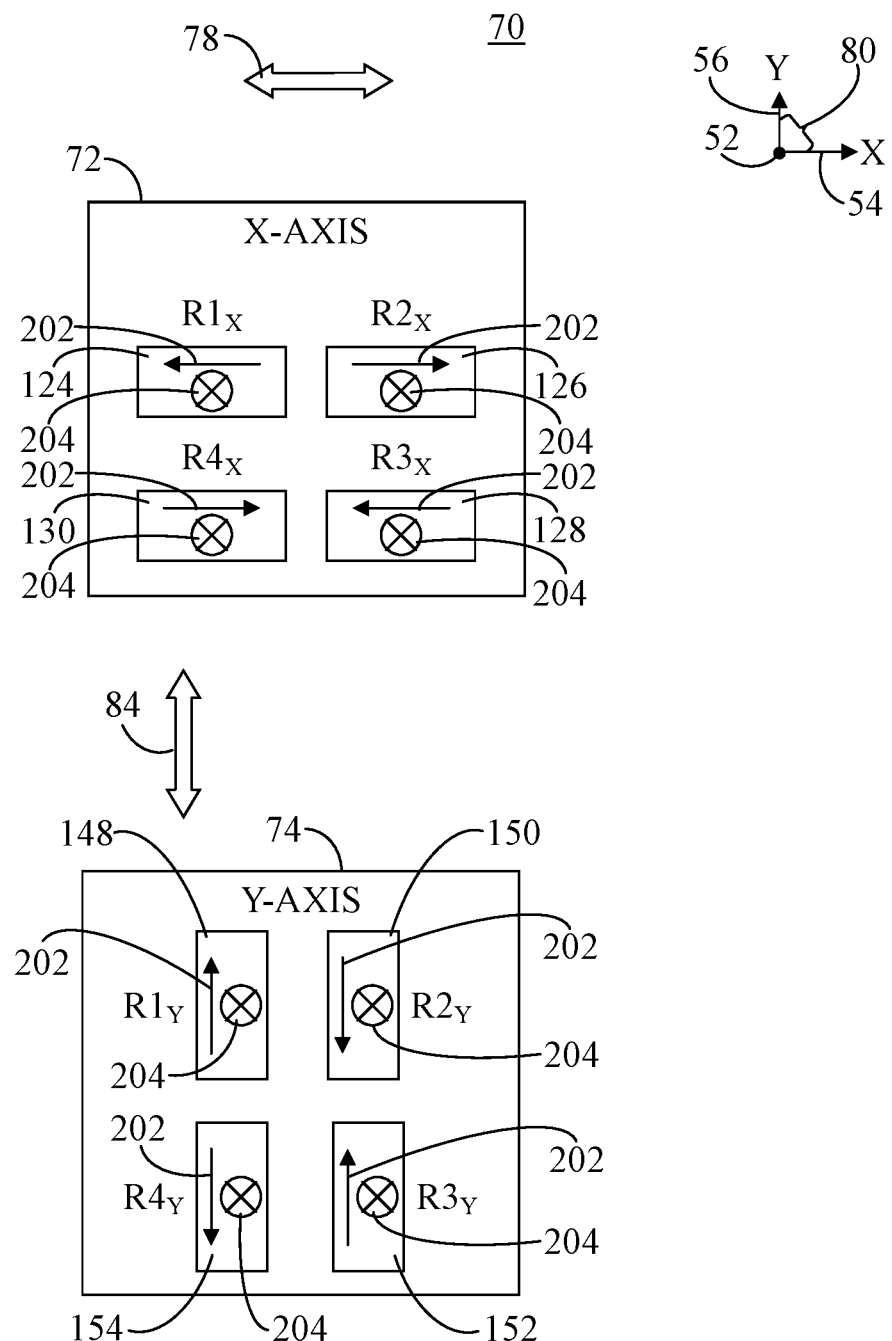
FIG. 4 shows a simplified top view of two magnetic field sensors within the sensor package of FIG. 3.

In accordance with an embodiment, pinned layer 196 has a reference magnetization, represented by a solid arrow 202, oriented substantially parallel to X-Y plane 80 (FIG. 4). Thus, as shown in FIG. 3, reference magnetization 202 of pinned layer 196 is represented by rightwardly and leftwardly directed arrows aligned with X-axis 54 for X-axis magnetic field sensor 72. Similarly, reference magnetization 202 is represented by rightwardly and leftwardly directed arrows aligned with Y-axis 56 for Y-axis magnetic field sensor 74. Conversely, reference magnetization 200 of pinned layer is only represented by rightwardly directed arrows aligned with X-axis 54 for Z-axis magnetic field sensor 76.

It should be observed that reference magnetization 202 of pinned layer 196 of each of first and third magnetoresistive sense elements 124, 128 of X-axis Wheatstone bridge 94 is oriented in a first direction (i.e., leftwardly) and reference magnetization 202 of pinned layer 196 of each of second and fourth magnetoresistive sense elements 126, 130 of X-axis Wheatstone bridge 94 is oriented in a second direction (i.e., rightwardly) that is antiparallel to the first direction. The same configuration holds true for Y-axis Wheatstone bridge 104. Thus, reference magnetization 202 of pinned layer 196 of each of first and third magnetoresistive sense elements 148, 152 of Y-axis Wheatstone bridge 104 is oriented in the leftward direction and reference magnetization 202 of pinned layer 196 of each of second and fourth magnetoresistive sense elements 150, 154 of Y-axis Wheatstone bridge 104 is oriented in the antiparallel rightward direction. However, reference magnetization 202 of pinned layer 196 of each of first, second, third, and fourth magnetoresistive sense elements 172, 174, 176, 178 of Z-axis Wheatstone bridge 114 is oriented in the rightward direction. Exemplary methodology that can enable the multiple orientations of reference magnetization 202 of pinned layer 196 will be discussed below in connection with FIG. 4.

Sense layer 198 has a sense magnetization, represented by an arrow 204, that is magnetically biased to have an initial orientation, in the absence of any of external magnetic fields, in an out-of-plane direction relative to X-Y plane 80 (FIG. 4). Furthermore, sense magnetization of sense layer 198 is orientable from the out-of-plane direction toward X-Y plane 80 in response to an external magnetic field. For each of X-axis and Y-axis magnetic field sensors 72, 74, the initial orientation of sense magnetization 204 is parallel to Z-axis 52, thus perpendicular to X-Y plane 80. As shown in FIG. 3, the initial orientation of sense magnetization 204 of sense layer 198 for each of X-axis and Y-axis magnetic field sensors 72, 74 is represented by downwardly directed arrows. However, for Z-axis field sensor 76, the initial orientation of sense magnetization 204, in the absence of external magnetic field 40, is not parallel to Z-axis 52 and is therefore non-perpendicular to X-Y plane 80. Accordingly, the initial orientation of sense magnetization 204 of sense layer 198 for Z-axis magnetic field sensor 76 is represented by diagonally directed (i.e., tilted) arrows.

In an embodiment, Z-axis magnetic field sensor 76 includes a first permanent magnet layer 206 and a second permanent magnet layer 208 each of which are spaced apart from magnetoresistive sense elements 172, 174, 176, 178 in order to achieve the non-perpendicular initial orientation of sense magnetization 204 for magnetoresistive sense elements 172, 174, 176, 178 of Z-axis field. More particularly, first and second permanent magnet layers 206 and 208 are located out-of-plane from magnetoresistive sense elements 172, 174, 176, 178. In general, the inclusion of first and second permanent magnet layers 206, 208 provides a bias field that suitably tilts sense magnetization 204 in order to enable detection of Z-axis magnetic field 40 in Z sensing direction 86 perpendicular to X-Y plane 80 (FIG. 4) of magnetic field sensor package 70. As such, no flux guides are required to guide Z-axis magnetic field 40 into X-Y plane 80. First and second permanent magnet layers 206, 208 and variations thereof will be discussed in greater detail in connection with FIGS. 5 and 6.

FIG. 4 shows a simplified top view of two magnetic field sensors within magnetic field sensor package 70 (FIG. 3). More particularly, FIG. 4 shows a top view of X-axis magnetic field sensor 72 and Y-axis magnetic field sensor 74 in order to demonstrate the multiple orientations of pinned layer 196 (FIG. 3) of magnetoresistive sense elements 124, 126, 128, 130, 148, 150, 152, 154.

With regard to X-axis magnetic field sensor 72, reference magnetization 202 of first and third magnetoresistive sense elements 124, 128 is oriented leftward on the page generally parallel to X-axis 54 and reference magnetization 202 of second and fourth magnetoresistive sense elements 126, 130 is oriented rightward on the page generally parallel to X-axis 54. Thus, reference magnetization 202 of pinned layer 196 (FIG. 3) for each of second and fourth magnetoresistive sense elements 126, 130 is antiparallel to reference magnetization 202 of pinned layer 196 for each of first and third magnetoresistive sense elements 124, 128. However, the initial orientation of sense magnetization 204 for each of magnetoresistive sense elements 124, 126, 128, 130 is in a single out-of-plane direction (directed into the page) resulting in a normal-to-plane magnetization vector for sense layer 198 (FIG. 3).

With regard to Y-axis magnetic field sensor 74, reference magnetization 202 of first and third magnetoresistive sense elements 148, 152 is oriented upward on the page generally parallel to Y-axis 56 and reference magnetization 202 of second and fourth magnetoresistive sense elements 150, 154 is oriented downward on the page generally parallel to Y-axis 56. Thus, reference magnetization 202 of pinned layer 196 (FIG. 3) for each of second and fourth magnetoresistive sense elements 150, 154 is antiparallel to reference magnetization 202 of pinned layer 196 for each of first and third magnetoresistive sense elements 148, 152. However, the initial orientation of sense magnetization 204 for each of magnetoresistive sense elements 148, 150, 152, 154 is in a single out-of-plane direction (directed into the page) resulting in a normal-to-plane magnetization vector for sense layer 198 (FIG. 3).

Although only top views of X-axis and Y-axis magnetic field sensors 72, 74 are shown in FIG. 4, it should be understood that reference magnetization 202 of magnetoresistive sense elements 172, 174, 176, 178 (FIG. 3) of Z-axis magnetic field sensor 76 is also oriented in X-Y-plane 80. For example, reference magnetization 202 of pinned layer 196 for all of first, second, third, and fourth magnetoresistive sense elements 172, 174, 176, 178 may be oriented in the same direction generally parallel to X-axis 54, instead of the antiparallel configurations of X-axis and Y-axis magnetic field sensors 72, 74.

In some embodiments, magnetic field sensor 70 may be programmed by setting reference magnetization 202 of magnetoresistive sense elements 124, 126, 128, 148, 150, 152, 154, 172, 174, 176, 178 in the predetermined direction in X-Y plane 80 of pinned layer 196. A programming operation may be thermally assisted (e.g., a thermally assisted switching process) wherein the programming operation includes heating selected ones of the MTJ magnetoresistive sense elements 124, 126, 128, 148, 150, 152, 154, 172, 174, 176, 178 to a high temperature threshold. In such a situation, magnetoresistive sense elements 124, 126, 128, 148, 150, 152, 154, 172, 174, 176, 178 may include an antiferromagnetic layer (not shown) that pins reference magnetization 202 of pinned layer 196 at a low temperature threshold and frees reference magnetization 202 at the high temperature threshold. Heating the selected magnetoresistive sense elements 124, 126, 128, 148, 150, 152, 154, 172, 174, 176, 178 at the high temperature threshold may be performed by passing a heating current in the selected magnetoresistive sense elements 124, 126, 128, 148, 150, 152, 154, 172, 174, 176, 178 via a current line (not shown). Other techniques may be implemented to provide localized heating, such as from a separate adjacent current line, by using a laser or other radiative source, and so forth. After switching reference magnetization 202 to the desired fixed magnetization orientation, the selected magnetoresistive sense elements 124, 126, 128, 148, 150, 152, 154, 172, 174, 176, 178 can be cooled to the low temperature threshold to pin, or fix, reference magnetization 202 in the switched state. Other embodiments may employ existing or upcoming techniques for pinning reference magnetization 202 to a desired magnetization orientation so as to achieve the multiple fixed orientations of reference magnetization 202 of pinned layer 196 of magnetoresistive sense elements 124, 126, 128, 148, 150, 152, 154, 172, 174, 176, 178.

As mentioned previously, the initial orientation of sense magnetization 204 of sense layer 198 (FIG. 3) for each of magnetoresistive sense elements 124, 126, 128, 130, 148, 150, 152, 154 (in the absence of an external magnetic field) is in a single out-of-plane direction resulting in a normal-to-plane magnetization vector for sense layer 198 (FIG. 3). In some embodiments, sense layer 198 may include a sense ferromagnetic layer and a non-magnetic layer. The specific structure of sense layer 198 is not illustrated herein for simplicity. The sense ferromagnetic layer of sense layer 198 may include any one of Co, Fe, Ni, or an alloy comprising any one or a combination of these elements. The non-magnetic layer may include any one of Pt, Pd, Ta, Hf, Nb, Cr, V, Cu, Au, Ti, Ag, Ru, W, or an alloy comprising any one or a combination of these elements. Through the material properties of the sense ferromagnetic layer and non-magnetic layer of sense layer 198, sense magnetization 204 of sense layer 198 of each of magnetoresistive sense elements 124, 126, 128, 148, 150, 152, 154, 172, 174, 176, 178 may be suitably self-biased in the single out-of-plane direction. Other embodiments may employ shape anisotropy, or other existing and upcoming techniques for initially orienting (i.e., self-biasing) sense magnetization 204 (in the absence of an external magnetic field) perpendicular to X-Y plane 80.

The Wheatstone bridge configurations (e.g., Wheatstone bridges 94, 104 shown in FIG. 3 for respective magnetic field sensors 72, 74), where $R1_i=R2_i=R3_i=R4_i$, with signal driven changes in $R1_i$ and $R3_i$ being opposed to the signal driven changes in $R2_i$ and $R4_i$ can enable a null (or near null) operating point which centers the output of the Wheatstone sensor bridge within the input range of the subsequent amplification circuitry. Additionally, the configuration of Wheatstone bridges 94, 104 enables good rejection (i.e., cancellation) of common mode effects in each sensor which helps to compensate for thermal effects or stress effects, power supply noise, and so forth. Furthermore, the differential configuration of Wheatstone bridges 94, 104 provides the highest sensitivity. In accordance with an embodiment in which sense magnetization 204 of sense layer 198 is biased in a vertical direction parallel to Z-axis 52, the parallel (in-plane) orientation of reference magnetization 202 of pinned layer 196 provides the optimal biasing point on the response curve of the MTJ—exactly in the center of the symmetric curve (at ninety degrees to each pinned vector) where the slope (sensitivity) is the greatest and signal linearity is the best.

With regard to Z-axis magnetic field sensor 76 (FIG. 3), the initial orientation of sense magnetization 204 of sense layer 198 (FIG. 3) for each of magnetoresistive sense elements 172, 174, 176, 178 (in the absence of an external magnetic field) is in a single out-of-plane direction that is non-perpendicular to X-Y plane 80. In order to achieve this desired initial orientation of sense magnetization 204 for each of magnetoresistive sense elements 172, 174, 176, 178, it may be possible to first implement any of the above discussed techniques for setting the initial orientation of sense magnetization 204 perpendicular to X-Y plane 80 during fabrication. Thereafter, first and second permanent magnet layers 206, 208 can be suitably formed to shift, i.e., rotate, sense magnetization 204 from the perpendicular orientation to the non-perpendicular out-of-plane orientation.

Figure 5:
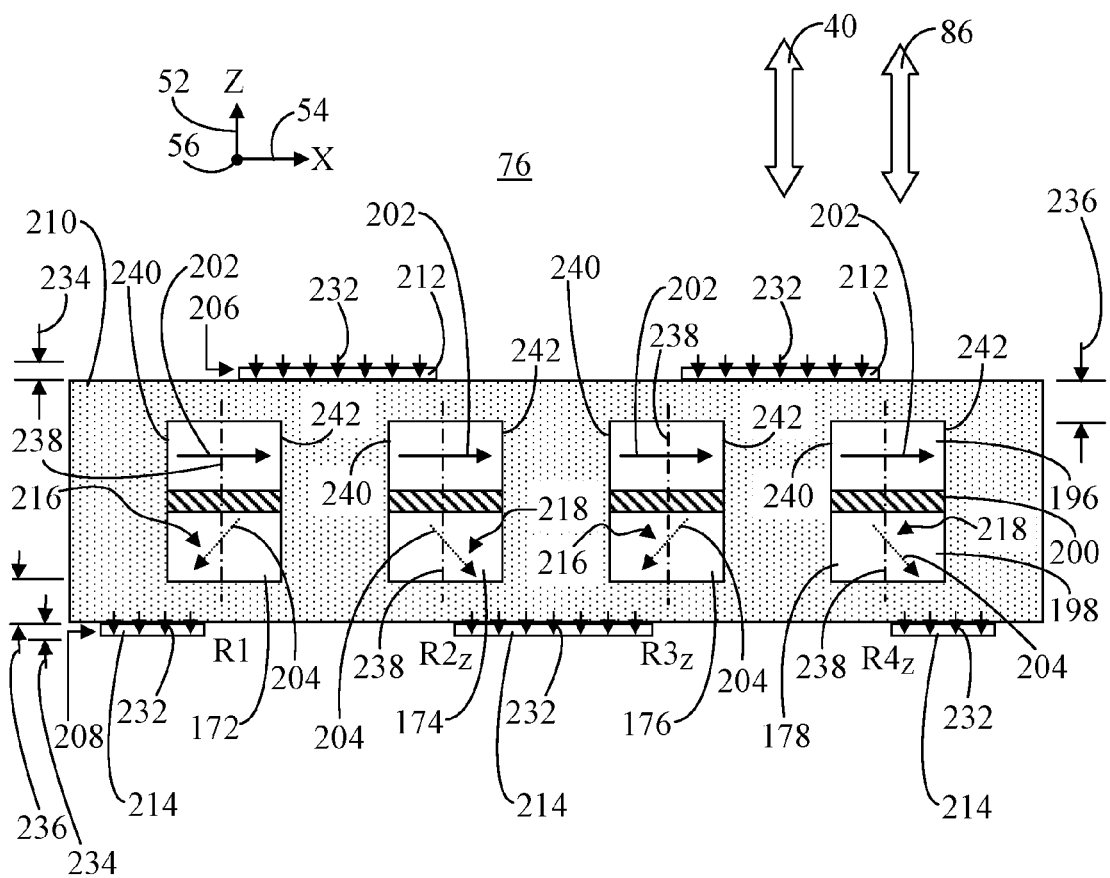
FIG. 5 shows a side view of one of the magnetic field sensors within the sensor package of FIG. 3 in accordance with an embodiment.

Referring now to FIG. 5, FIG. 5 shows a side view of Z-axis magnetic field sensor 76 within magnetic field sensor package 70 (FIG. 3). FIG. 5 is provided to illustrate that each of magnetoresistive sense elements 172, 174, 176, 178 can be fabricated utilizing current techniques so that sense elements 172, 174, 176, 178 are formed in a common plane (i.e., they are arranged in-plane) relative to one another within a dielectric material 210 with suitable electrically conductive interconnections (not shown) to form Z-axis Wheatstone bridge 114 (FIG. 3). Again, reference magnetization 202 of pinned layer 196 of each of first, second, third, and fourth magnetoresistive sense elements 172, 174, 176, 178 is oriented in a single direction parallel to X-axis 54.

FIG. 5 further demonstrates an exemplary arrangement of segments 212 of first permanent magnet layer 206 and segments 214 of second permanent magnet layer 208. As will be discussed below, a suitable shape, location, and magnetic orientation of segments 212, 214 of first and second permanent magnet layers 206, 208 enables tilted biasing out of X-Y plane 80 of sense magnetization 204 of sense layer 198 for each of magnetoresistive sense elements 172, 174, 176, 178. More particularly, inclusion of first and second permanent magnet layers 206, 208 magnetically biases sense magnetization 204 of sense layer 198 of each of first and third magnetoresistive sense elements 172, 176 in a first direction 216. Additionally, inclusion of first and second permanent magnet layers 206, 208 magnetically biases sense magnetization 204 of sense layer 198 of each of second and fourth magnetoresistive sense elements 174, 178 in a second direction 218 that differs from first direction 216. Thus, in response to Z-axis external magnetic field 40, sense magnetization 204 of sense layer 198 of each of first and third magnetoresistive sense elements 172, 176 is orientable from first direction 216 toward plane 80 and sense magnetization 204 of sense layer 198 of each of second and fourth magnetoresistive sense elements 174, 178 is orientable from second direction 218 toward plane 80.

Figure 6:
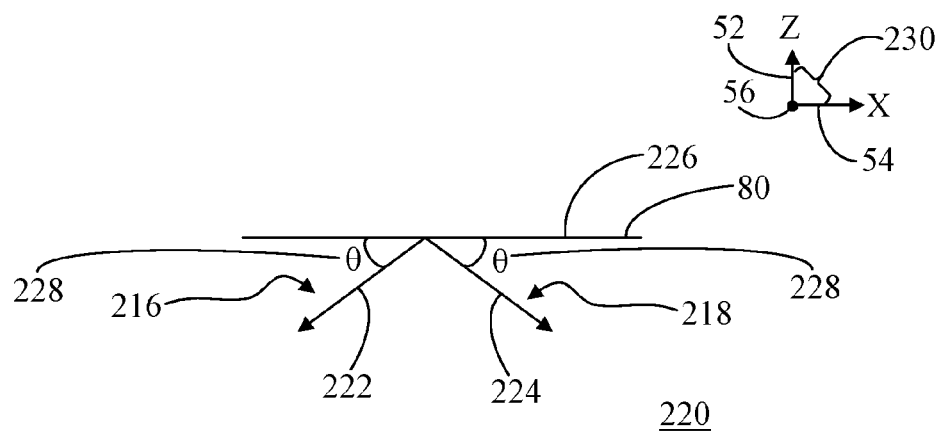
FIG. 6 shows a diagram of multiple bias field vectors generated by the inclusion of one or more permanent magnet layers with the magnetic field sensor of FIG. 5.

Referring to FIG. 6 in connection with FIG. 5, FIG. 6 shows a diagram 220 of multiple bias field vectors generated by the inclusion of first and second permanent magnet layers 206, 208 within Z-axis magnetic field sensor 76. More particularly, a first bias field vector 222 corresponds to sense magnetization 204 of sense layer 198 oriented in first direction 216 for first and third magnetoresistive sense elements 172, 176. Additionally, a second bias field vector 224 corresponds to sense magnetization 204 of sense layer 200 oriented in second direction 218 for second and fourth magnetoresistive sense elements 174, 178.

A horizontal line 226 in diagram 220 represents X-Y plane 80 (FIG. 4) of Z-axis magnetic field sensor 76. As such, X-Y plane 80 is oriented left-and-right and in-and-out of the page upon which diagram 220 is drawn. As shown, each of first and second directions 216, 218 of sense magnetization 204 (as represented by first and second bias field vectors 222, 224) is tilted below X-Y plane 80 by an equivalent angular magnitude 228, labeled θ in diagram 220. Additionally, first and second directions 216, 218 of sense magnetization 204 are oriented in opposing directions.

An X-Z plane 230 is oriented perpendicular to X-Y plane 80. Thus, X-Z plane 230 is oriented left-and-right and up-and-down on the page upon which diagram 220 is drawn.

As represented by first and second bias field vectors 222, 224, second direction 218 of sense magnetization 204 of second and fourth magnetoresistive sense elements 174, 178 is coplanar with first direction 216 of sense magnetization 204 of first and third magnetoresistive sense elements 172, 176 within X-Z plane 230, and is therefore out of X-Y plane 80.

With reference back to FIG. 5, each of first and second permanent magnet layers 206, 208 is located out-of-plane from magnetoresistive sense elements 172, 174, 176, 178. In this exemplary illustration, first permanent magnet layer 206 is located out-of-plane above magnetoresistive sense elements 172, 174, 176, 178 and second permanent magnet layer 208 is located out-of-plane below magnetoresistive sense elements 172, 174, 176, 178. Thus, magnetoresistive sense elements 172, 174, 176, 178 are interposed between first and second permanent magnet layers 206, 208. In other embodiments, first and second permanent magnet layers 206, 208 may be displaced out-of-plane relative to one another, but may be generally co-planar with magnetoresistive sense elements 172, 174, 176, 178. Further, although two permanent magnet layers 206, 208 are shown, alternative embodiments may include only one or more than two permanent magnet layers.

In order to enable the suitable out-of-plane biasing of sense magnetization 204 of sense layer 198 and to concurrently enable efficiency in fabrication, each of first and second permanent magnet layers 206, 208 has a single magnetic orientation, a single thickness, and a single spacing away from magnetoresistive sense elements 172, 174, 176, 178. In this example, a magnetic orientation 232 of each of segments 212, 214 of first and second permanent magnet layers 206, 208 is substantially perpendicular to X-Y plane 80 (FIG. 4) of magnetic field sensor package 70 (FIG. 3). More specifically, magnetic orientation 232 is parallel to Z-axis 52 and is directed downward on the page. Additionally, first and second permanent magnet layers 206, 208 are suitably deposited, patterned, and etched such that segments 212, 214 are each characterized by a single thickness 234. Thus, the entire area of first and second permanent magnet layers 206, 208 is of the same thickness 234. Furthermore, first and second permanent magnet layers 206, 208 are formed on dielectric material 210 so that each of first and second permanent magnet layers 206, 208 is characterized by a single out-of-plane spacing 236 away from magnetoresistive sense elements 172, 174, 176, 178.

Each of magnetoresistive sense elements 172, 174, 176, 178 can be characterized by a central axis 238 oriented parallel to Z-axis 52 and therefore perpendicular to X-Y plane 80 (FIG. 4). Central axis 238 distinguishes a first side 240 of each of magnetoresistive sense elements 172, 174, 176, 178 from a second side 242 of each of magnetoresistive sense elements 172, 174, 176, 178. In the illustration, first side 240 is to the left of central axis 238 and second side 242 is to the right of central axis 238 for each of magnetoresistive sense elements 172, 174, 176, 178.

In the example shown, a first portion of magnet segments 212 of first permanent magnet layer 206 may be positioned closer to second side 242 of each of first and third magnetoresistive sense elements 172, 176 than to first side 240 of each of first and third magnetoresistive sense elements 172, 176. Conversely, a second portion of magnet segments 212 of first permanent magnet layer 206 may be positioned closer to first side 240 of each of second and fourth magnetoresistive sense elements 174, 178 than to second side 242 of each of second and fourth magnetoresistive sense elements 174, 178. Further, a first portion of magnet segments 214 of second permanent magnet layer 208 may be positioned closer to first side 240 of each of first and third magnetoresistive sense elements 172, 176 than to second side 242 of each of first and third magnetoresistive sense elements 172, 176. Conversely, a second portion of magnet segments 214 of second permanent magnet layer 208 may be positioned closer to second side 242 of each of second and fourth magnetoresistive sense elements 174, 178 than to first side 240 of each of second and fourth magnetoresistive sense elements 174, 178.

Accordingly, first and second permanent magnet layers 206, 208 can be strategically patterned (shape, location, and position) to generate two unique, bias field vectors in X-Z plane 230 of sense layer 198 (one of which is oriented in first direction 216 and the other of which is oriented in second direction 218) to enable Wheatstone bridge 114 (FIG. 3) to respond to Z-axis external magnetic field 40 in Z sensing direction 86. Further, a Z-axis magnetic field sensor may be subject to parasitic coupling effects on the Z-axis magnetic field sensor due to X-axis external magnetic field 38 (FIG. 3) and/or Y-axis external magnetic field 82 (FIG. 3). These parasitic coupling effects lead to inter-axis coupling of the sensor response in which X-axis external magnetic field 38 and/or Y-axis external magnetic field 82 may be sensed by the Z-axis magnetic field sensor. Accordingly inter-axis coupling of the sensor response can lead to error and/or inaccuracy of the sensed Z-axis magnetic field. The two unique, bias field vectors in X-Z plane 230 of sense layer 198 can greatly reduce or eliminate this inter-axis coupling for improved accuracy of the sensed Z-axis magnetic field.

Figure 7:
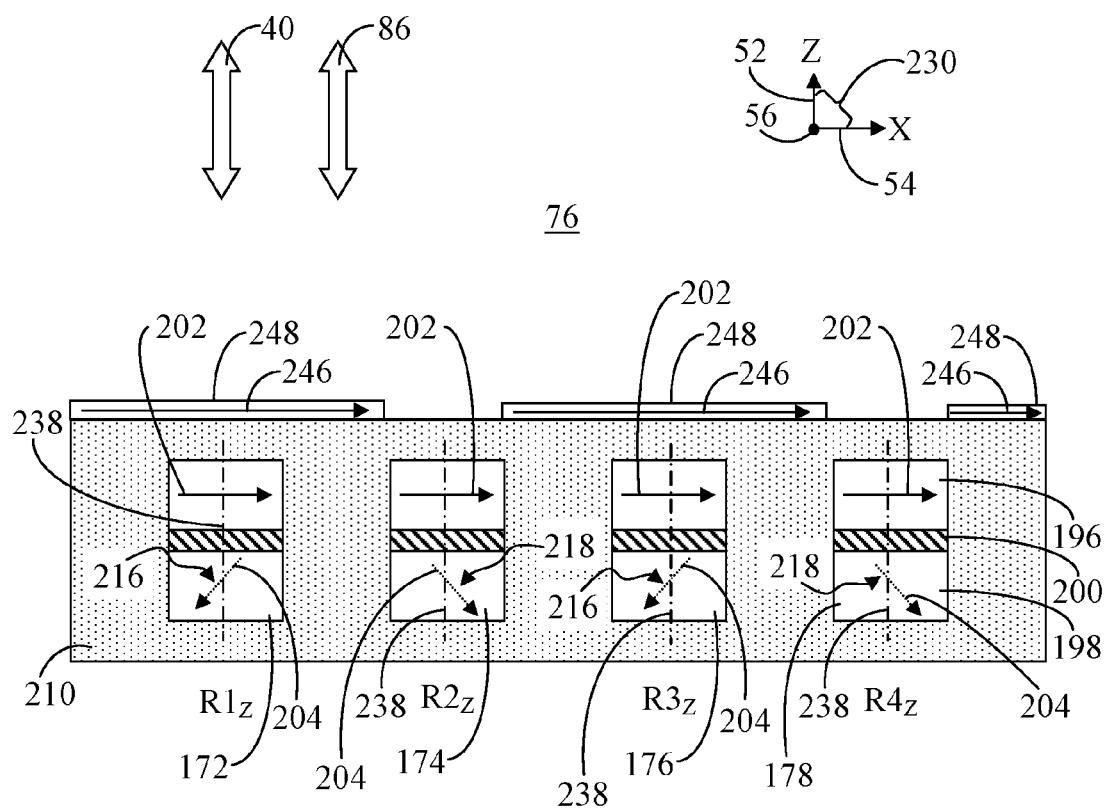
FIG. 7 shows a side view of one of the magnetic field sensors within the sensor package of FIG. 3 in accordance with an alternative embodiment.

Referring now to FIG. 7, FIG. 7 shows a side view of Z-axis magnetic field sensor 76 within magnetic field sensor package 70 (FIG. 3) in accordance with an alternative embodiment. This exemplary illustration includes a single permanent magnet layer 244 having magnet segments 248 that are located out-of-plane from magnetoresistive sense elements 172, 174, 176, 178. In this exemplary illustration, a magnetic orientation 246 of each of magnet segments 248 of permanent magnet layer 244 is substantially parallel to X-Y plane 80 (FIG. 4) of magnetic field sensor 70. More specifically, magnetic orientation 246 is parallel to X-axis 54 and is directed rightward on the page. Again, permanent magnet layer 244 is strategically patterned (shape, location, and position) to generate two unique, bias field vectors in X-Z plane 230 of sense layer 198 (one of which is oriented in first direction 216 and the other of which is oriented in second direction 218) to enable Wheatstone bridge 114 (FIG. 3) to respond to Z-axis external magnetic field 40 in Z sensing direction 86.

Figure 8:
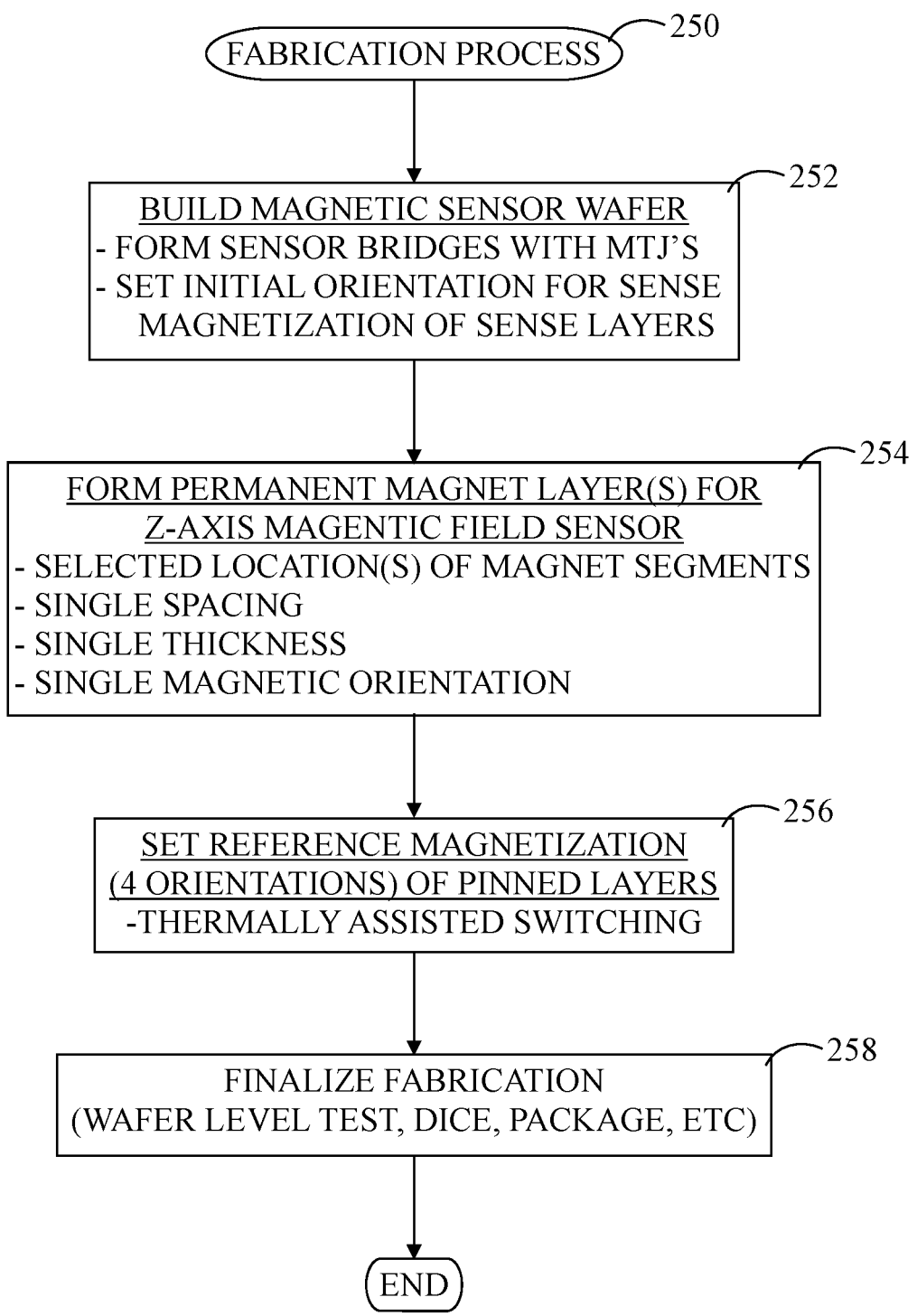
FIG. 8 shows a flowchart of a fabrication process for manufacturing the magnetic field sensor of FIG. 3.

FIG. 8 shows a flowchart of a fabrication process 250 in accordance with another embodiment. Fabrication process 250 is described in connection with the fabrication of magnetic field sensor package 70 (FIG. 3) having three sense axes (e.g., X-axis, Y-axis, Z-axis magnetic field sensors 72, 74, 76). Thus, FIG. 3 should be viewed in concurrence with the fabrication methodology of FIG. 8. However, fabrication process 250 may be readily adapted to produce a single or dual sense axis magnetic field sensor.

Those skilled in the art will recognize that fabrication process 250 is exemplary in nature. Thus, only the primary operations of fabrication process 250 are discussed herein for simplicity. Furthermore, the process blocks depicted in FIG. 8 may be performed in parallel with each other or with performing other processes, and each process block will include many separate process steps. In addition, it is to be understood that the particular ordering of the process blocks depicted in FIG. 8 may be modified while achieving substantially the same result. Accordingly, such modifications are intended to be included within the scope of the inventive subject matter.

At a process block 252, a magnetic sensor wafer is built, i.e., fabricated, utilizing known methodologies to produce a plurality of sensor bridges (e.g., Wheatstone bridges 94, 104, 114). Each of the sensors bridges are thus fabricated to include four sensor legs, with each sensor leg having one or more magnetoresistive sense elements, e.g., MTJ's. Fabrication of the magnetic sense wafer concurrently entails setting (i.e., self-biasing) the initial orientation of sense magnetization 204 of sense layer 198 of each of the magnetoresistive sense elements by building sense layer 198 to include ferromagnetic and non-magnetic layers, by "growing in" or otherwise treating sense layer 198, and/or by shape anisotropy so that sense magnetization 204 of sense layer 198, in the absence of an external magnetic field, will be in an out-of-plane direction relative to X-Y plane 80 (FIG. 4) of magnetic field sensor package 70.

At a process block 254, one or more permanent magnet layers (e.g., first and second permanent magnet layers 206, 208 of FIG. 5 or single permanent magnet layer 244 of FIG. 7) is suitably formed for Z-axis magnetic field sensor 76 in order to magnetically bias sense magnetization 204, in the absence of Z-axis external magnetic field 40, in the out-of-plane first and second directions 216, 218 (FIGS. 5 and 7) that is also non-perpendicular to X-Y plane 80 (FIG. 4). Considerations for biasing sense magnetization 204 include selecting locations at which magnet segments 212, 214 (FIG. 5) or magnet segments 248 (FIG. 7) will be positioned, a single out-of-plane spacing 236 (FIG. 5) of the magnet segments from magnetoresistive elements 172, 174, 176, 178, a single thickness 234 (FIG. 5) of the permanent magnet layer(s), and a single magnetic orientation (i.e., the out-of-plane magnetic orientation 232 of FIG. 5 or the planar magnetic orientation 246 of FIG. 7) of magnet segments 210. Formation of the permanent magnet layer(s) may entail deposition, patterning, and etching of a suitable material to form the magnet segments. Such material may include iron, nickel, cobalt, some alloys of rare earth materials or an alloy comprising any one or a combination of these elements that is magnetized and creates its own persistent magnetic field. Preferably, the permanent magnet layer(s) is formed from a magnetically "hard" material that is subjected to processing in a powerful magnetic field during manufacture to align its internal microcrystalline structure, so as to make it very difficult to demagnetize.

At a process block 256, reference magnetization 202 of pinned layers 196 of each of the magnetoresistive sense elements is set. By way of example, a thermally assisted switching (TAS) process may be performed to set reference magnetization 202, as discussed above. In accordance with an embodiment, four orientations of reference magnetization 202 may be set. Two orientations of reference magnetization 202 are aligned with X-axis 54, but are antiparallel relative to one another for X-axis magnetic field sensor. A single orientation of reference magnetization 202 is aligned with X-axis 54 for Z-axis magnetic field sensor 76. Additionally, two orientations of reference magnetization 202 are aligned with Y-axis 56, but are antiparallel relative to one another for Y-axis magnetic field sensor 74.

At a process block 258, fabrication of the magnetic sensor wafer continues with fabrication finalization processes such was wafer level testing, dicing, packaging, and the like. Thereafter, fabrication process 250 ends.

Thus, embodiments disclosed herein entail a magnetic field sensor capable of sensing magnetic fields along one or more mutually exclusive sense axes, typically referred to as the X-axis, Y-axis, and Z-axis. An embodiment of a magnetic field sensor comprises a sensor bridge, the sensor bridge including a first sensor leg and a second sensor leg. A first magnetoresistive sense element is formed in the first leg and is located in a plane of the magnetic field sensor, the first magnetoresistive sense element having a first pinned layer and a first sense layer. A second magnetoresistive sense element formed in the second leg and located in the plane of the magnetic field sensor, the second magnetoresistive sense element having a second pinned layer and a second sense layer. The first and second magnetoresistive sense elements are sensitive to an external magnetic field along a sensing direction, wherein each of the first and second pinned layers has a reference magnetization oriented substantially parallel to the plane, and each of the first and second sense layers has a sense magnetization. A permanent magnet layer is spaced apart from the first and second magnetoresistive sense elements, wherein in the absence of the external magnetic field, the permanent magnet layer magnetically biases the sense magnetization in an out-of-plane orientation relative to the plane, the sense magnetization of the first sense layer being oriented in a first direction and the sense magnetization of the second sense layer being oriented in second direction that differs from the first direction.

Accordingly, a sensor bridge configuration of magnetoresistive sense elements can be implemented for each sense axis. The sensor bridges incorporate multiple orientations of reference magnetization of the pinned layer, along with out-of-plane biasing of the sense layer for each of the magnetoresistive sense elements. Additionally, one sensor bridge design is utilized for sensing an external magnetic field that is perpendicular to the plane of the magnetic field sensor package and includes at least one permanent magnetic layer with a single magnetization direction to enable sensing of the out-of-plane external magnetic field without the use of flux concentrators. More particularly, the at least one permanent magnet layer is strategically patterned (shape and position) to generate two unique, in-plane external bias field vectors of the sense layer to allow a single sensor bridge to respond to the out-of-plane external magnetic field without inter-axis coupling of sensor response. The various inventive concepts and principles embodied herein enable an ultra low power, multiple sense axis magnetic field sensor without detrimental perming effects for improved sensitivity, reliability, and cost savings.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A magnetic field sensor comprising:
a sensor bridge, said sensor bridge including a first sensor leg and a second sensor leg;
a first magnetoresistive sense element formed in said first leg and located in a plane of said magnetic field sensor, said first magnetoresistive sense element having a first pinned layer and a first sense layer;
a second magnetoresistive sense element formed in said second leg and located in said plane of said magnetic field sensor, said second magnetoresistive sense element having a second pinned layer and a second sense layer, said first and second magnetoresistive sense elements being sensitive to an external magnetic field along a sensing direction, wherein each of said first and second pinned layers has a reference magnetization oriented substantially parallel to said plane, and each of said first and second sense layers has a sense magnetization; and
a permanent magnet layer spaced apart from said first and second magnetoresistive sense elements, wherein in the absence of said external magnetic field, said permanent magnet layer magnetically biases said sense magnetization in an out-of-plane orientation relative to said plane, said sense magnetization of said first sense layer being oriented in a first direction and said sense magnetization of said second sense layer being oriented in second direction that differs from said first direction.

2. The magnetic field sensor of claim 1 wherein:
said sense magnetization of said first sense layer of said first magnetoresistive sense element is orientable from said first direction toward or away from said plane of said magnetic field sensor in response to said external magnetic field; and
said sense magnetization of said first sense layer of said first magnetoresistive sense element is orientable from said second direction toward or away from said plane of said magnetic field sensor in response to said external magnetic field.

3. The magnetic field sensor of claim 1 wherein in the absence of said external magnetic field, said out-of-plane orientation of said sense magnetization of each of said first and second sense layers is non-perpendicular to said plane of said magnetic field sensor.

4. The magnetic field sensor of claim 1 wherein each of said first and second directions of said sense magnetization of said first and second magnetoresistive sense elements is tilted below said plane of said magnetic field sensor by an equivalent angular magnitude.

5. The magnetic field sensor of claim 1 wherein said second direction is coplanar with said first direction in said out-of-plane orientation.

6. The magnetic field sensor of claim 1 wherein said external magnetic field is perpendicular to said plane of said magnetic field sensor, and inclusion of said permanent magnet layer enables detection of said external magnetic field in said sensing direction that is also perpendicular to said plane of said magnetic field sensor.

7. The magnetic field sensor of claim 1 wherein said permanent magnet layer is characterized by a single magnetic orientation.

8. The magnetic field sensor of claim 7 wherein said single magnetic orientation is substantially perpendicular to said magnetic field sensor.

9. The magnetic field sensor of claim 7 wherein said single magnetic orientation is substantially parallel to said magnetic field sensor.

10. The magnetic field sensor of claim 1 wherein:
each of said first and second magnetoresistive sense elements is characterized by a central axis, said central axis distinguishing a first side of said each of said first and second magnetoresistive sense elements from a second side of said each of said first and second magnetoresistive sense elements; and
said permanent magnet layer comprises a first magnet segment and a second magnet segment, said first magnet segment being positioned closer to said second side of said first magnetoresistive sense element than to said first side of said first magnetoresistive sense element to orient said first sense layer in said first direction, and said second magnet segment being positioned closer to said first side of said second magnetoresistive sense element than to said second side of said second magnetoresistive sense element to orient said second sense layer in said second direction.

11. The magnetic field sensor of claim 1 wherein said permanent magnet layer is a first permanent magnet layer and said magnetic field sensor further comprises a second permanent magnet layer vertically displaced away from said first permanent magnet layer, wherein said first and second magnetoresistive sense elements are interposed between said first and second permanent magnet layers, and said first and second permanent magnet layers function cooperatively to magnetically bias said sense magnetization of said first and second magnetoresistive sense elements in said out-of-plane orientation relative to said plane.

12. The magnetic field sensor of claim 1 wherein said reference magnetization of each of said first and second pinned layers is oriented in the same direction substantially parallel to said plane.

13. The magnetic field sensor of claim 1 wherein said sensor bridge further comprises:
a third sensor leg having a third magnetoresistive sense element formed therein, said third magnetoresistive sense element having a third pinned layer and a third sense layer; and
a fourth sensor leg having a fourth magnetoresistive sense element formed therein, said fourth magnetoresistive sense element having a fourth pinned layer and a fourth sense layer, wherein:
said first, second, third, and fourth sensor legs are coupled as a Wheatstone bridge such that said first and fourth magnetoresistive sense elements are coupled in series to form a first half of said Wheatstone bridge, said second and third magnetoresistive sense elements are coupled in series to form a second half of said Wheatstone bridge, said first half of said Wheatstone bridge is coupled in parallel with said second half of said Wheatstone bridge such that a first junction of said first and second magnetoresistive sense elements forms a first input terminal and a second junction of said third and fourth magnetoresistive sense elements forms a second input terminal;
said reference magnetization of each of said first, second, third, and fourth pinned layers of each of said first and third magnetoresistive sense elements is oriented in the same direction substantially parallel to said plane; and
said permanent magnet layer is spaced apart from said third and fourth magnetoresistive sense elements, said permanent magnet layer magnetically biasing said sense magnetization of said third sense layer in said first direction and magnetically biasing said sense magnetization of said fourth sense layer in said second direction.

14. A magnetic field sensor comprising:
a sensor bridge, said sensor bridge including a first sensor leg and a second sensor leg;
a first magnetoresistive sense element formed in said first leg and located in a plane of said magnetic field sensor, said first magnetoresistive sense element having a first pinned layer and a first sense layer;
a second magnetoresistive sense element formed in said second leg and located in said plane of said magnetic field sensor, said second magnetoresistive sense element having a second pinned layer and a second sense layer, said first and second magnetoresistive sense elements being sensitive to an external magnetic field along a sensing direction, wherein each of said first and second pinned layers has a reference magnetization oriented substantially parallel to said plane, and each of said first and second sense layers has a sense magnetization; and
a permanent magnet layer spaced apart from said first and second magnetoresistive sense elements, wherein in the absence of said external magnetic field, said permanent magnet layer magnetically biases said sense magnetization in an out-of-plane orientation relative to said plane, said out-of-plane orientation of each of said first and second sense layers is non-perpendicular to said plane of said magnetic field sensor, said sense magnetization of said first sense layer being oriented in a first direction and said sense magnetization of said second sense layer being oriented in second direction that differs from said first direction, and said second direction being coplanar with said first direction.

15. The magnetic field sensor of claim 14 wherein:
said sense magnetization of said first sense layer of said first magnetoresistive sense element is orientable from said first direction toward or away from said plane of said magnetic field sensor in response to said external magnetic field; and
said sense magnetization of said first sense layer of said first magnetoresistive sense element is orientable from said second direction toward or away from said plane of said magnetic field sensor in response to said external magnetic field.

16. The magnetic field sensor of claim 14 wherein each of said first and second directions of said sense magnetization of said first and second magnetoresistive sense elements is tilted below said plane of said magnetic field sensor by an equivalent angular magnitude.

17. The magnetic field sensor of claim 14 wherein said external magnetic field is perpendicular to said plane of said magnetic field sensor, and inclusion of said permanent magnet layer enables detection of said external magnetic field in said sensing direction that is also perpendicular to said plane of said magnetic field sensor.

18. A magnetic field sensor comprising:
a sensor bridge, said sensor bridge including a first sensor leg and a second sensor leg;
a first magnetoresistive sense element formed in said first leg and located in a plane of said magnetic field sensor, said first magnetoresistive sense element having a first pinned layer and a first sense layer;
a second magnetoresistive sense element formed in said second leg and located in said plane of said magnetic field sensor, said second magnetoresistive sense element having a second pinned layer and a second sense layer, said first and second magnetoresistive sense elements being sensitive to an external magnetic field along a sensing direction, wherein each of said first and second pinned layers has a reference magnetization oriented substantially parallel to said plane, and each of said first and second sense layers has a sense magnetization, said reference magnetization of each of said first and second pinned layers being oriented in the same direction substantially parallel to said plane; and
a permanent magnet layer spaced apart from said first and second magnetoresistive sense elements, wherein in the absence of said external magnetic field, said permanent magnet layer magnetically biases said sense magnetization in an out-of-plane orientation relative to said plane, said out-of-plane orientation of said sense magnetization of each of said first and second sense layers being non-perpendicular to said plane of said magnetic field sensor, said sense magnetization of said first sense layer being oriented in a first direction and said sense magnetization of said second sense layer being oriented in second direction that differs from said first direction.

19. The magnetic field sensor of claim 18 wherein each of said first and second directions of said sense magnetization of said first and second magnetoresistive sense elements is tilted below said plane of said magnetic field sensor by an equivalent angular magnitude.

20. The magnetic field sensor of claim 18 wherein said sensor bridge further comprises:
a third sensor leg having a third magnetoresistive sense element formed therein, said third magnetoresistive sense element having a third pinned layer and a third sense layer; and
a fourth sensor leg having a fourth magnetoresistive sense element formed therein, said fourth magnetoresistive sense element having a fourth pinned layer and a fourth sense layer, wherein:
said first, second, third, and fourth sensor legs are coupled as a Wheatstone bridge such that said first and fourth magnetoresistive sense elements are coupled in series to form a first half of said Wheatstone bridge, said second and third magnetoresistive sense elements are coupled in series to form a second half of said Wheatstone bridge, said first half of said Wheatstone bridge is coupled in parallel with said second half of said Wheatstone bridge such that a first junction of said first and second magnetoresistive sense elements forms a first input terminal and a second junction of said third and fourth magnetoresistive sense elements forms a second input terminal;
said reference magnetization of each of said first, second, third, and fourth pinned layers of each of said first and third magnetoresistive sense elements is oriented in the same direction substantially parallel to said plane; and
said permanent magnet layer is spaced apart from said third and fourth magnetoresistive sense elements, said permanent magnet layer magnetically biasing said sense magnetization of said third sense layer in said first direction and magnetically biasing said sense magnetization of said fourth sense layer in said second direction.

* * * * *